US008833806B2

(12) United States Patent
Wang et al.

(10) Patent No.: US 8,833,806 B2
(45) Date of Patent: Sep. 16, 2014

(54) FRONT OPENING UNIFIED POD WITH LATCH STRUCTURE

(75) Inventors: Chien-Feng Wang, New Taipei (TW); Ming-Long Chiu, New Taipei (TW); Shao-Wei Lu, Taoyuan County (TW); Tzu-Jeng Hsu, Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 226 days.

(21) Appl. No.: 13/562,555

(22) Filed: Jul. 31, 2012

(65) Prior Publication Data

US 2013/0146503 A1 Jun. 13, 2013

(30) Foreign Application Priority Data

Dec. 13, 2011 (TW) .............................. 100145976 A

(51) Int. Cl.
*E05C 1/00* (2006.01)

(52) U.S. Cl.
USPC .............................. 292/159; 292/32; 220/323

(58) Field of Classification Search
USPC ............. 292/159, DIG. 12, 32; 206/710, 711; 220/323; 414/217, 217.1
See application file for complete search history.

(56) References Cited

U.S. PATENT DOCUMENTS

| 6,902,063 | B2* | 6/2005 | Pai et al. ....................... 206/710 |
| 7,077,270 | B2* | 7/2006 | Matsutori ...................... 206/710 |
| 7,677,393 | B2* | 3/2010 | Burns et al. .................... 206/710 |
| 8,540,289 | B2* | 9/2013 | Nakatogawa et al. .......... 292/37 |
| 2002/0106266 | A1* | 8/2002 | Bonora et al. ................ 414/217 |
| 2007/0080096 | A1* | 4/2007 | Miyajima et al. ............. 206/710 |
| 2010/0038281 | A1* | 2/2010 | Lin et al. ....................... 206/710 |

* cited by examiner

*Primary Examiner* — David Fidei
(74) *Attorney, Agent, or Firm* — Rosenberg, Klein & Lee

(57) ABSTRACT

A Front Opening Unified Pod (FOUP) has a pair of latch structures, and the latch structures install in a door of the FOUP. The latch structures use a circular rotary turntable to drive a pair of sliding devices, let the latch structures can lock or unlock more stabilized, and use sliding rollers respectively disposed on the sliding devices to prevent the generation of dusts.

20 Claims, 16 Drawing Sheets

FRONT OPENING UNIFIED POD WITH LATCH STRUCTURE

BACKGROUND OF THE INVENTION

1. Field of the Invention

The present invention is related to a front opening unified pod (FOUP), and more particularly, to at least one of latch structure disposed in a FOUP.

2. Description of the Prior Art

The semiconductor process consists of multiple procedures or steps, during which wafers are to be placed in different locations or different machines, and therefore in the process, wafers need to be transported from one place to another and even stored for certain period of time as required by the process flow. Wherein, wafer cassettes function both as storage containers and transportation containers and need to be compatible with different types of transportation and carrying devices and thus play a very important role in the semiconductor process.

As shown in FIG. 1, in which is a conventional front opening unified pod (FOUP). The FOUP, usually formed by one-piece injection molding, has a container body A and the inner side of the container body A is disposed with a plurality of wafer supporting pieces B; the wafer supporting pieces B and the container body A can be formed by one-piece injection molding, or the container body A can be formed with a plurality of integrated sockets by one-piece injection molding and the wafer supporting pieces B are then snap-fitted into the integrated sockets.

However, as the size of wafers increases, to over 300 mm for example, the size of wafer containers also needs to be increased. Yet when a large-sized wafer container is formed with injection molding using polymer material, the stress induced by the polymer material may cause distortion of the container body during its formation and may further lead to distortion of integrated wafer supporting pieces or sockets formed by one-piece injection molding; since the wafer supporting pieces or sockets are symmetrically disposed on left and right sides (for wafers to be horizontally placed in the container), slight distortion may lead to tilted position of wafers and affect the process and may even cause cracks in wafers and thus result in serious losses.

The door is usually disposed with retaining components that co-operates with the wafer supporting pieces to secure wafers in the container body; however, retaining components are generally fixed to the door and when the wafers placed in the container body are large-sized ones, the vibration of wafers may be stronger while being carried due to its large size, and fixed retaining components may result in lack of cushioning that causes wafers in the wafer container to crack and thus severe losses.

Moreover, a conventional latch structure comprises complex mechanical structures, which are more susceptible to breakdown and also friction during the process of operation that leads to contamination of wafers.

In addition, OHT system is usually used for carrying wafer containers, and an OHT head C (as shown in FIG. 1) is usually disposed on top of wafer containers to facilitate the robot in gripping and lifting wafer containers to other process platforms. The conventional OHT head C is usually lock-fastened with a plurality of lock-fasteners disposed at its center.

Loaded with large-sized wafers, a large-sized FOUP weighs heavier than a conventional small-sized FOUP. As the conventional OHT head C is only lock-fastened to the FOUP with a plurality of lock-fasteners and has to sustain the weight of the large-sized FOUP and of wafers within, distortion and cracks of the upper side of the FOUP may occur easily, and the OHT head C may break loose from the large-sized FOUP, which may fall down and be damaged and thus lead to a larger cost loss.

Furthermore, as a large-sized FOUP is manually transported with its opening facing upward, when the FOUP is placed on a flat surface, weight of large-sized wafers in the FOUP may exert considerable impact when the FOUP and the surface are in contact and thus result in cracks or chipping of large-sized wafers in the FOUP.

SUMMARY OF THE INVENTION

In order to solve the aforementioned problems, one primary objective of the present invention is to provide a FOUP with its door disposed with a latch structure in which a circular rotary drives sliding devices for the latch structure to be securely locked and unlocked and for preventing extra vibration or accidental collision during locking and unlocking processes, wherein rollers are also employed to prevent the generation of dust.

According to the aforementioned objective, the present invention provides A FOUP, comprising: a container body, having an opening for importing and exporting said plurality of wafers, two opposite edges at said opening of said container body respectively disposed with at least a pair of sockets; a door, joined with said opening of said container body for protecting said plurality of wafers inside said container body, and two opposite edges of said door respectively disposed with at least a pair of latch holes corresponding to said pair of sockets; at least a pair of concave areas are disposed in said door, each of said pair of concave areas disposed with a latch structure, said latch structure comprising: a circular rotary, having a first surface and a second surface, said first surface disposed with a rotating portion and said second surface disposed with a braking portion at its central area; at least a pair of driving pieces formed on two opposite ends on periphery of said circular rotary; and a pair of sliding devices respectively disposed on two opposite sides of periphery of said circular rotary, each of said pair of sliding devices having a first end close to said circular rotary and a second end opposite to said first end, said first end formed with a hook-shaped engaging portion and a sliding portion and said second end formed with at least a latch bolt that corresponds to said latch holes of said door, wherein, said hook-shaped engaging portions hook said driving pieces for said sliding devices to be engaged with said circular rotary, and rotation of said circular rotary is controlled by said braking portion, and said latch bolts of said sliding devices are thus driven to and fro between said pair of sockets and said pair of latch holes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to make the structure and characteristics as well as the effectiveness of the present invention to be further understood and recognized, the detailed description of the present invention is provided as follows along with embodiments and accompanying figures.

Figure 1:
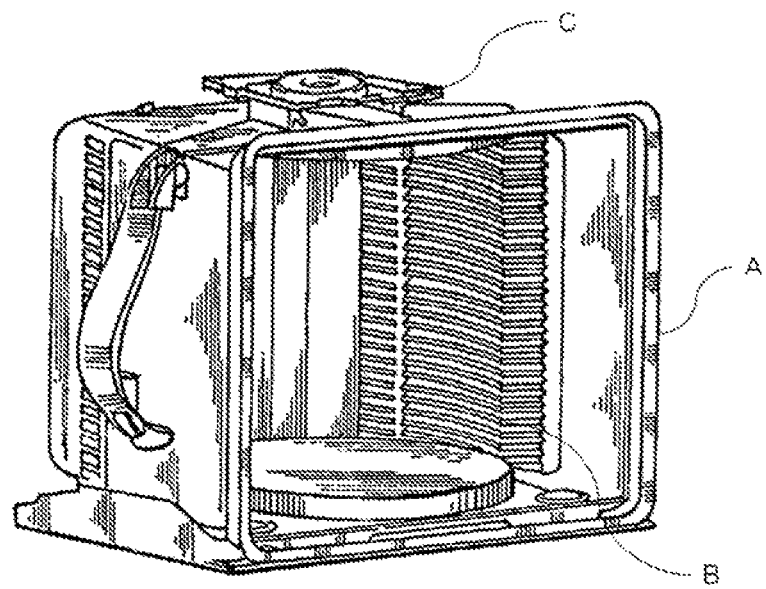
FIG. 1 is a view of a conventional FOUP.
Figure 2:
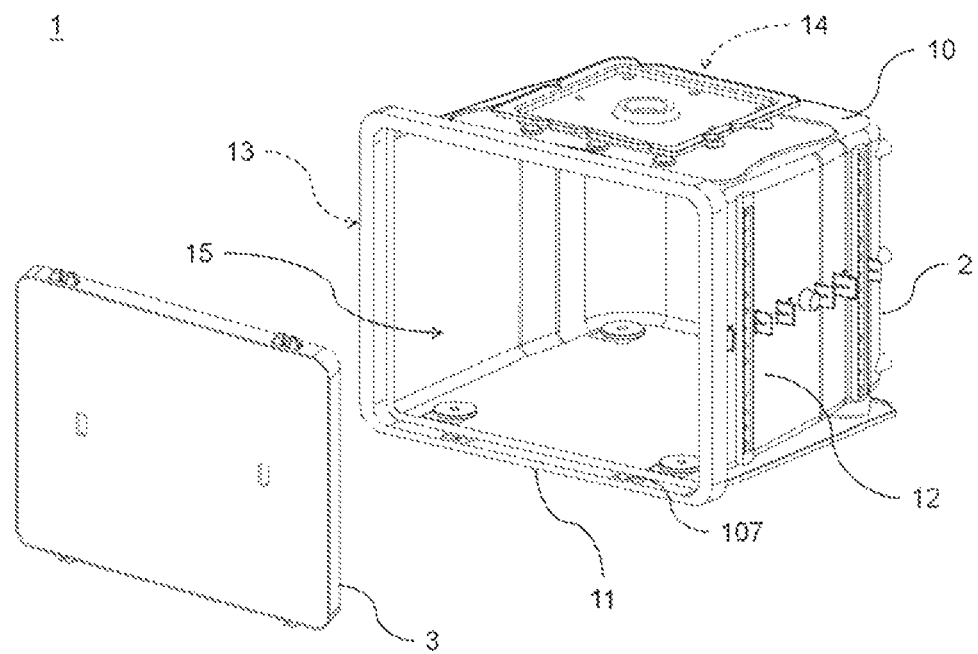
FIG. 2 is a view of the container body of FOUP of the present invention.

First, referring to FIG. 2, which is a view of the container body of FOUP of the present invention. As shown in FIG. 2, the FOUP 1 comprises a container body 2 composed of left side 13, right side 12, upper side 10, and lower side 11 joined with rear side 14 to form an accommodation space, an opening 15 opposite to the rear side 14, and a door 3 sized to correspond to the size of the opening 15 of the container body 2 and to close the opening 15 of the container body 2.

Figure 3:
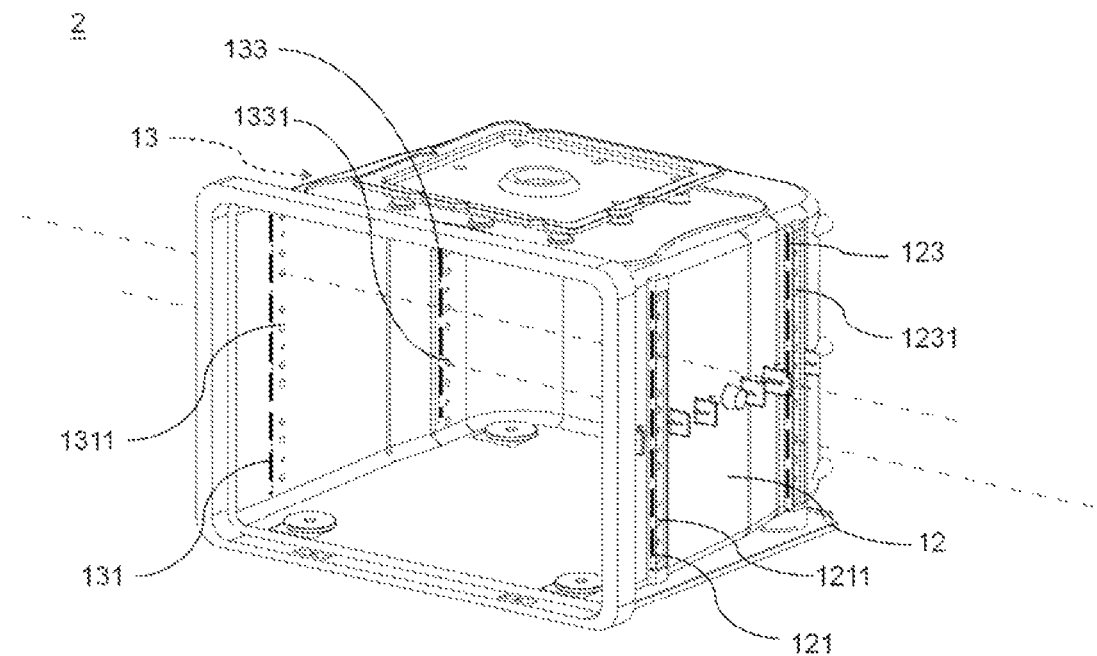
FIG. 3 is a view of the through holes of FOUP of the present invention.

Then, referring to FIG. 3, which is a view of the through holes of wafer container of the present invention. As shown in FIG. 3, when a large-sized FOUP, i.e. a 450 mm FOUP or an even larger FOUP, is manufactured with injection molding, it is more difficult to control the formation of the shape of container body and distortion and deformation may occur. To prevent from deformation that results in asymmetry of supporting pieces (integrated or snap-fitting structure) on two sides of the wafer container, integrated supporting pieces (or snap-fitting structure of supporting pieces) are not formed first in the injection molding process. Instead, the wafer container is first formed by injection molding, and then an additional calibration system such as laser or other high-precision lathe bed apparatus is used to mark out symmetrical positions on the right side 12 and the left side 13 of the container body 2 and drill a plurality of first through holes 1211, 1231, 1311, and 1331 respectively on the right side 12 near the front end 121 and the rear end 123 and on the left right 13 near the front end 131 and the rear end 133. In one embodiment of the present invention, thirteen first through holes 1211, 1231, 1311, and 1331 are respectively drilled on the right side 12 near the front end 121 and the rear end 123 and on the left right 13 near the front end 131 and the rear end 133; the number of drilled holes on each side corresponds precisely (as indicated by dotted lines), which will be described in detail in the following. What is to be emphasized here is that the number of drilled holes is not limited in the present invention and that the embodiment in which thirteen first through holes are drilled as described above is only to specifically illustrate this technical characteristic of the present invention.

Figure 4A:
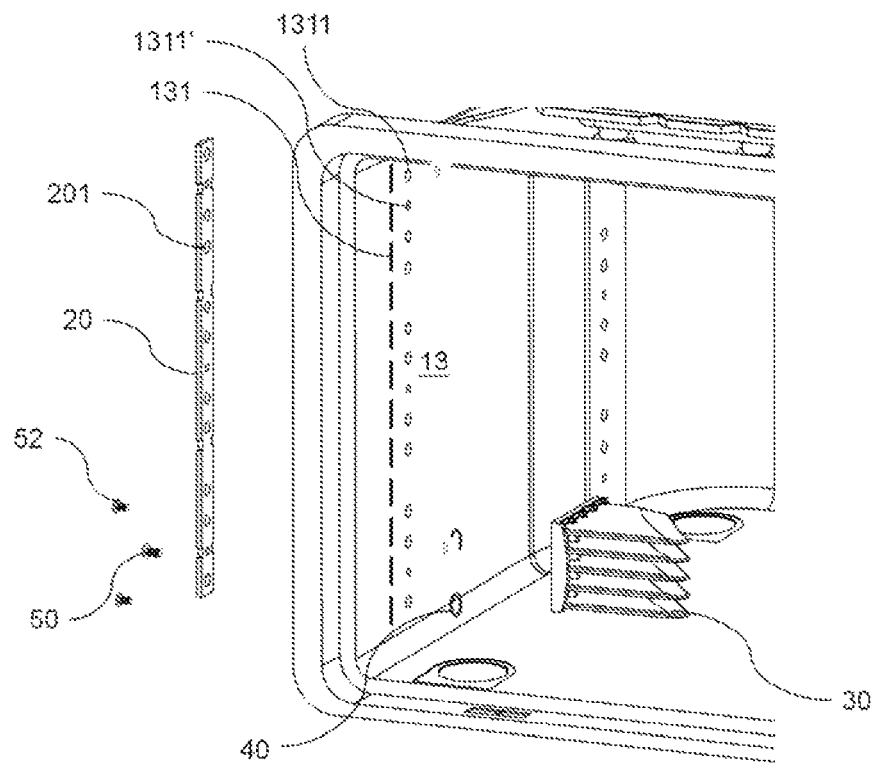
FIG. 4A is a view of the supporting pieces of the present invention being disposed.

Then, referring to FIG. 4A, which is a view of the supporting pieces of the present invention being disposed. As shown in FIG. 4A, the structure of the front end 121 and the rear end 123 of the right side 12 and the structure of the front end 131 and rear end 133 of the left side 13 are the same, and the first through holes 1211 and 1231 and the first through holes 1311 and 1331 on the left side 13 are also structurally the same, and the method of installing and the structure of supporting pieces 39 are also the same. Therefore, the installation of supporting pieces 30 on the rear end 131 of the left side 13 is used as a representative example and described in the following and the description of installation of supporting pieces on other sides is thus omitted.

Referring then to FIG. 4A, a plurality of first through holes 1311 are disposed near the front end 131 of the left side 13 of the container body 2, wherein, the embodiment of the present invention as described has thirteen first through holes 1311. As shown in FIG. 4A, a positioning frame 20 is formed with a plurality of second through holes 201, and each of the plurality of second through holes 201 is formed and positioned by precise processing; for example, in the embodiment of the present invention, the positioning frame 20 is formed with thirteen second through holes 201, and the second through holes 201 are disposed in correspondence to the first through holes 1311 for the positioning frame 20 to be lock-fastened to the outer side of left side 13 of the container body 2 near the front end 131. In one embodiment, there are in total thirteen first through holes 1311 as described above, and the three first through holes 1311' that are respectively positioned at top, middle, and bottom are to receive the first lock-fasteners 50 that lock-fasten the positioning frame 20. In addition, the material of the positioning frame 20 can be metal or engineering plastic.

Figure 4B:
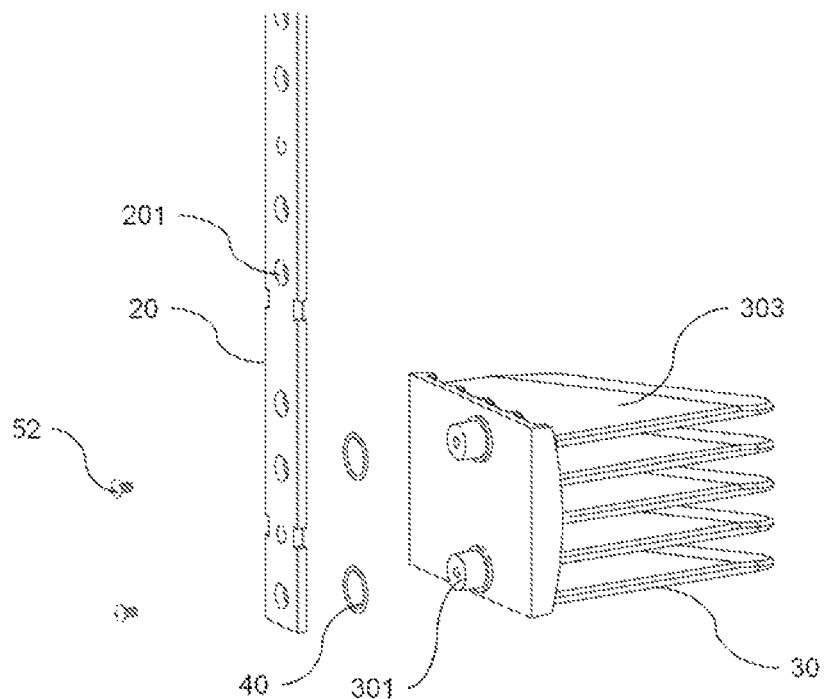
FIG. 4B is a view of the supporting module of the present invention.

Then, referring to FIG. 4B, which is a view of the supporting module of the present invention. As shown in FIG. 4B, the plurality of supporting modules 30 have a plurality of protruding lock-fastening holes 301 formed on one side and a plurality of ribs 303 horizontally arranged at intervals formed on another side. The protruding lock-fastening holes 301 of each supporting module 30 penetrate each of the rest of the second through holes 201 on the positioning frame 20 and each of the rest of the first through holes 1311 at the front end 131 of the left side 13 of the container body 2, and each supporting module 30 is then fastened to the inner left side 13 near the front end 131 with a plurality of second lock-fasteners 52. A seal ring 40 can be further disposed on the lock-fastening holes 301 of each supporting module 30 to achieve air-tightness in the FOUP 1.

In an embodiment of the present invention, each end is respectively disposed with five supporting modules 30, and each of the supporting modules 30 has two lock-fastening holes 301 and five ribs 303; therefore, there are ten lock-fastening holes 301 and twenty-five ribs 303 in total, and the ten lock-fastening holes 301 can be respectively received by the rest of the first through holes 1311 of the container body 2 and the rest of the second through holes 201 on the positioning frame 20. What is to be emphasized here is that the number of the first through holes 1311 and the number of the second through holes 201 are not limited in the present invention, both numbers being determined by the number of the supporting modules 30 disposed and the number of the positioning frames 20 to be lock-fastened. And then, with the four ends, the front end 121 and rear end 123 of the right side 12 and the front end 131 and rear end 133 of the left side 13, being respectively disposed with supporting modules 30, each supporting module 30 corresponding to each of the four ends is loaded with five wafers; apparently, in one embodiment of the present invention, there are five sets (four ends as a set) of supporting modules 30 in the accommodation space in the container body 2, and thus twenty-five wafers in total can be loaded; what is to be emphasized is that the number of wafers placed in the accommodation space in the container body 2 is not limited in the present invention.

Figure 5A:
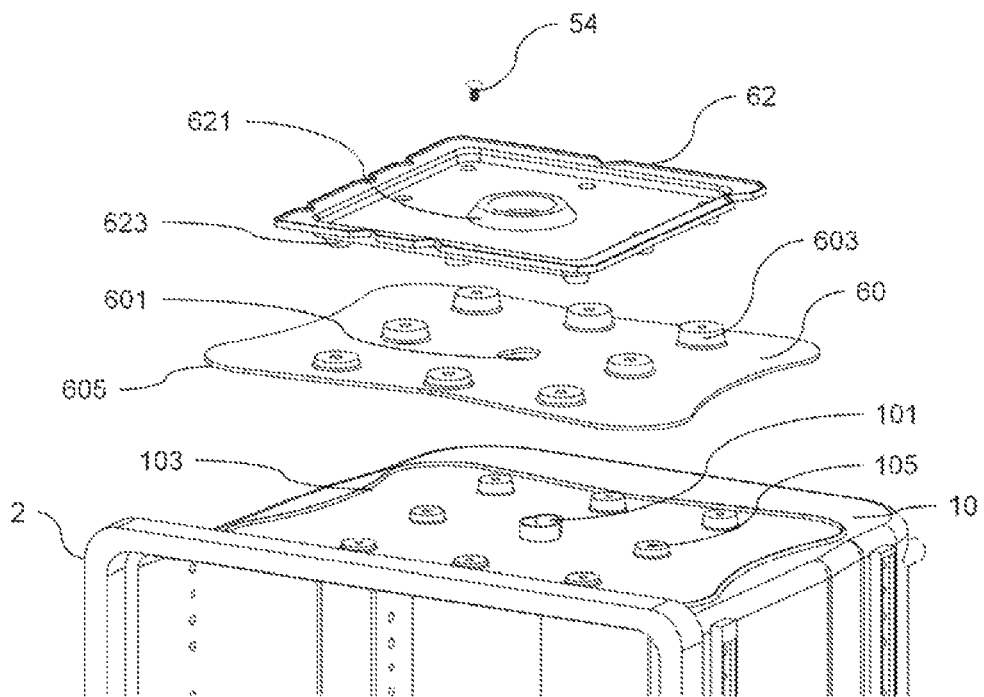
FIG. 5A is a view of the structure of the Overhead Hoist Transport pad (OHT pad) and the Overhead Hoist Transport head (OHT head) of the present invention.

Then, referring to FIG. 5A, which is a view of the structure of the Overhead Hoist Transport pad and the Overhead Hoist Transport head of the present invention, and in the following description, the Overhead Hoist Transport pad will be referred to as "OHT pad" and the Overhead Hoist Transport head will be referred to as "OHT head." As shown in FIG. 5A, a protruding member 101 is formed on the upper side 10 of the container body 2, a ring-shaped snap-fitting groove 103 is formed around the protruding member 101 on the upper side 10, and a plurality of first studs 105 are formed between the snap-fitting groove 103 and the protruding member 101; then, an OHT pad 60 and an OHT head 62 are further disposed on the upper side 10 of the container body 2, wherein, the OHT pad 60 is disposed on the upper side 10 of the container body 2, a through hole 601 is formed at the center of the OHT pad 60, and a plurality of protruding second studs 603 are formed around the through hole 601; the second studs 603 can be in the form of through holes, which is not limited in the present invention. These second studs 603 correspond to the plurality of first studs 105. A snap-fitting piece 605 corresponding to the snap-fitting groove 103 on the upper side 10 can be further formed around the OHT pad 60. Moreover, a round mortise member 621 is formed at the center of the OHT head 62, a plurality of protruding third through holes 623 are formed on one side, and the third through holes 623, the second studs 603, and the first studs 105 are correspondingly disposed. Then, after the round mortise member 621 of the OHT head 62 penetrates the through hole 601 of the OHT pad 60 and then engages with the protruding member 101, the snap-fitting piece 605 of the OHT pad 60 is then snap-fitted to the snap-fitting groove 103 on the upper side 10, the second studs 603 on the OHT pad 60 and the plurality of first studs 105 on the upper side 10 of the container body 2 and the third through holes 623 on the OHT head 62 are aligned, and a plurality of third lock-fasteners 54 are used to lock-fasten the second studs 603 and the third through holes 623 to the plurality of first studs 105 on the upper side 10 of the container body 2 for joining together the OHT pad 60, the OHT head 62, and the upper side 10 of the container body 2.

The primary function of adding the OHT pad 60 in the present invention is to distribute the weight sustained by the OHT head 60 when the robot transports the FOUP. The OHT head of a conventional FOUP is lock-fastened to the wafer container with a plurality of lock-fasteners. Yet as far as a larger-sized FOUP is concerned, with the OHT head lock-fastened to the container body only with a plurality lock-fasteners, it is difficult for the OHT head to sustain the weight of the FOUP and twenty-five wafers placed within when the FOUP is lifted and transported during semiconductor process in the semiconductor fabrication plant. Therefore, with the structure of an OHT pad 60, the present invention is able to distribute the weight of the FOUP and twenty-five wafers placed within sustained by the OHT head. Apparently, the present invention provides a snap-fitting structure comprising the snap-fitting piece 605 of the OHT pad 60 and the snap-fitting groove 103 of the upper side 10 that evenly distributes the weight; with the plurality of protruding second studs 603 on the OHT pad 60 and the plurality of third through holes 623 of the OHT head 62 being lock-fastened together via the third lock-fasteners 54, the OHT head 62 can be more securely lock-fastened to the plurality of first studs 105 on the upper side 10 of the container body 2, and with the round mortise member 621 at the center of the OHT head 62 being disposed in the rear of the center of gravity of the FOUP 1 and the round mortise member 621 being engaged with the protruding member 101 of the upper side 10 of the container body 2, the OHT head 62 can be kept balanced without vibration. In addition, the material of the OHT pad 60 of the present invention can be engineering plastic of high hardness, and more particularly, the hardness of material of the OHT pad 60 is higher than that of the material of the container body.

Figure 5B:
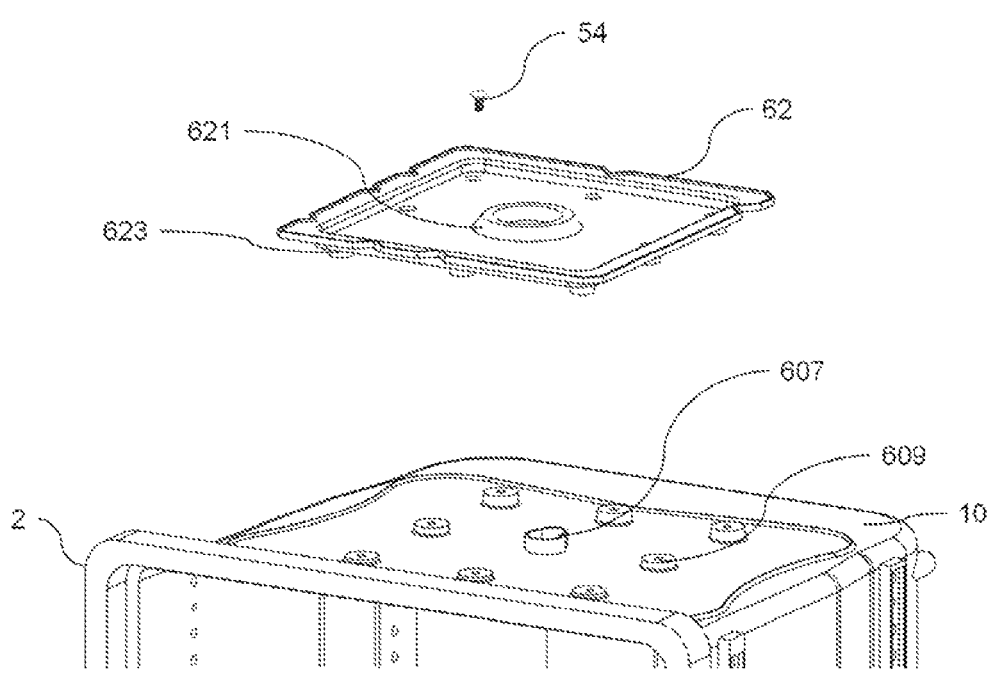
FIG. 5B is a view of the structure of another embodiment of OHT pad of the present invention.

And then, referring to FIG. 5B, which is a view of the structure of another embodiment of OHT pad 60 of the present invention. As shown in FIG. 5B, OHT pad 60 is formed on the upper side 10 of the container body 2 with embedded injection molding, a protruding member 607 is formed at the center of OHT pad 60, and a plurality of protruding undercut mortise members 609 are formed around the protruding member 607; an OHT head 62 is disposed with a round mortise member 621 formed at the center, and a plurality of protruding third through holes 623 are formed on one side, wherein the third through holes 623 and the undercut mortise members 609 are correspondingly disposed; a plurality of third lock-fasteners 54 are used to lock-fasten the undercut mortise members 609 with the third through holes 623 for joining together the OHT pad 60 and the OHT head 62; wherein, the round mortise member 621 of the OHT head 62 engages the protruding member 607 of the OHT pad 60.

The OHT pad 60 of the present embodiment is formed on the upper side 10 of the container body 2 with embedded injection molding, and thus the design of the snap-fitting piece 605 and the snap-fitting groove 103 as shown in FIG. 5A is not needed. Moreover, as the OHT pad 60 is formed with the container body 2 by embedded injection, the situation in which the OHT pad 60 breaks loose from the container body 2 can be avoided, and such structure can distribute the weight of FOUP and twenty-five wafers sustained by the OHT head more evenly.

Figure 6A:
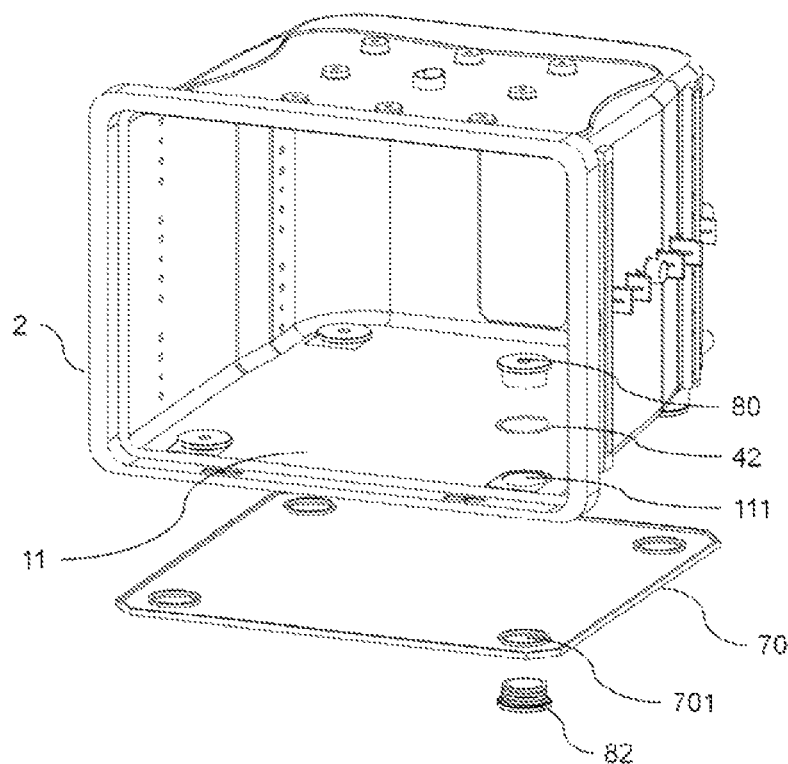
FIG. 6A is a view of the base of the present invention.

Referring to FIG. 6A, which is a view of the base of the present invention. As shown in FIG. 6A, a first ventilation hole 111 is respectively formed at each of the four corners of the lower side 11 of the container body 2, and a base 70 is further disposed below the FOUP 1; wherein, a plurality of second ventilation holes 701 are formed on the base 70, and each of the second ventilation holes 701 and each of the first ventilation holes 111 are correspondingly disposed.

Figure 6B:
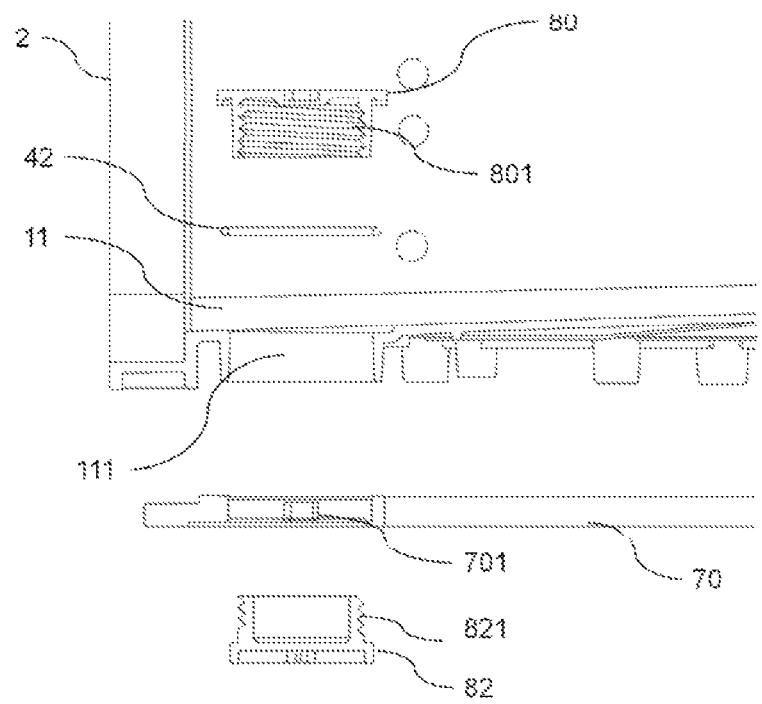
FIG. 6B is a view of the buckling components of the present invention.

Then, referring to FIG. 6B, which is a view of the buckling components of the present invention. As shown in FIG. 6B, a plurality of buckling components comprise first components 80 having inner teeth and second components 82 having outer teeth. The inner teeth 801 of each of the first components 81 penetrate each of the first ventilation holes 111, and the outer teeth 821 of each of the second components 82 penetrate each of the second ventilation holes 701. Therefore, with the Inner teeth 801 and the outer teeth 821 being engaged, the first components 81 and the second components 82 are joined for the base 70 and the lower side 11 of the container body 2 to be joined together.

The buckling components of the present invention can also be snap-fitting pieces with a hollow structure, and thus, after the base 70 and the lower side 11 of the container body 2 are joined together via the snap-fitting pieces, the hollow structure is disposed with a purging valve (or an exhausting valve) for the base 70 to be equipped with purging (or exhausting) function after being joined together with the lower side 11 of the FOUP; and a seal ring 42 can be further disposed on each of the first components 80 or the second components 82 to achieve air-tightness in FOUP 1.

Figure 7:
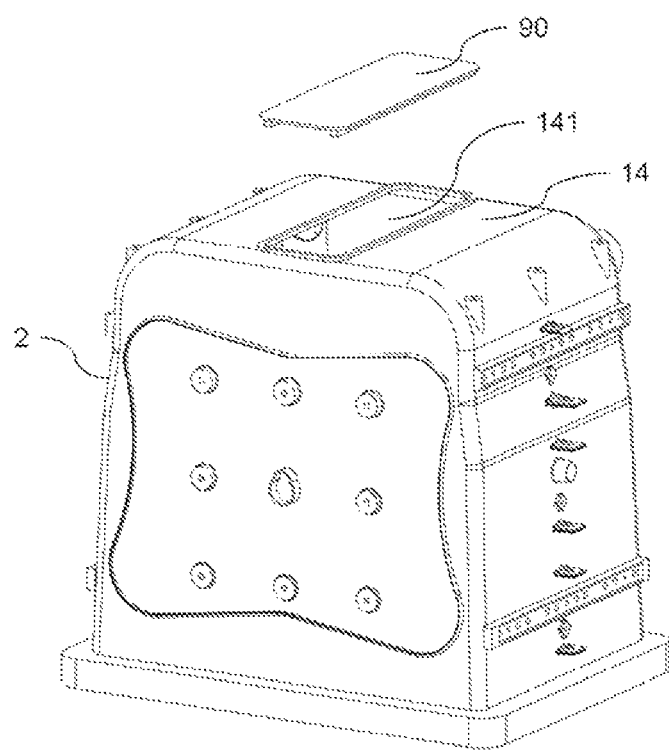
FIG. 7 is a view of the rear side of the present invention.

Referring then to FIG. 7, which is a view of the rear side of the present invention. As shown in FIG. 7, on the rear side 14 of the FOUP of the present invention, a rear opening 141 opposite to the opening 15 can be further formed; an objective of forming this rear opening 141 is to facilitate the calibration and measurement of the semiconductor equipment. And at the rear opening 141, a flat piece 90 can be embedded in the rear opening 141, wherein the flat piece 90 can be transparent or opaque. In one embodiment of the present invention, the flat piece 90 is embedded in the rear opening 141 of the container body 2 via ultrasonic welding; however, the method of embedding or joining the flat piece 90 is not limited in the present invention. Moreover, the material of flat piece 90 of the present invention can be anti-UV engineering plastic material of high cleanliness, and similarly, the material of flat piece 90 is not limited in the present invention. Furthermore, scales and letters such as numbers, process stages, and barcodes can be marked on the transparent flat piece 90 to facilitate the operation of the process.

Figure 8A:
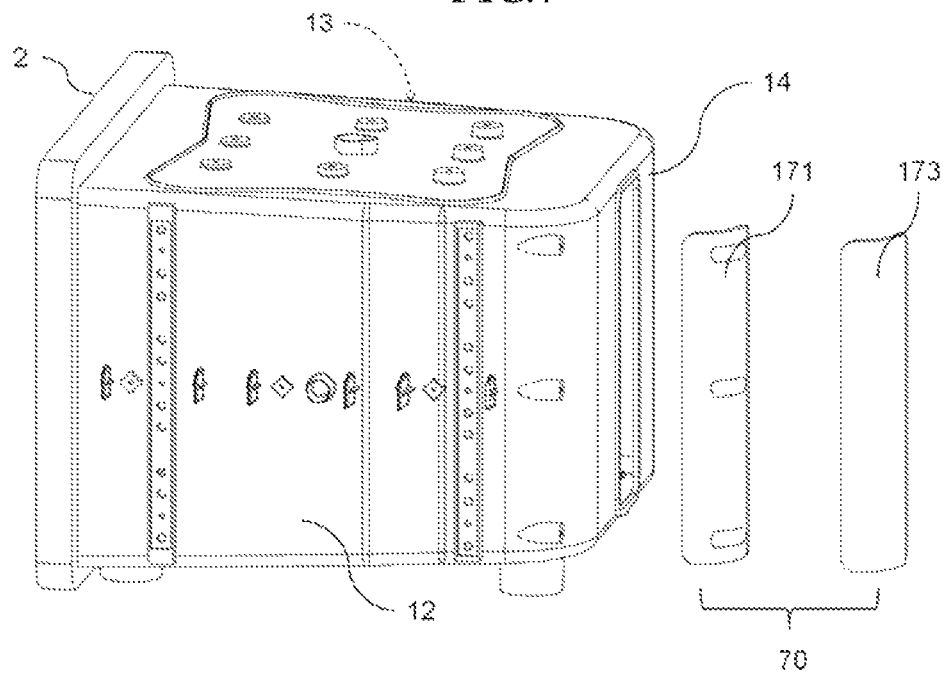
FIG. 8A is a view of the vibration-proof component of the present invention.

Referring to FIG. 8A, which is a view of the vibration-proof component of the present invention. As shown in FIG. 8A, a vibration-proof component 17 is respectively disposed behind the container body 2 of the FOUP 1, on the right side 12 and the left side 13, and at the corners where the two sides join the rear side 14. The vibration-proof component 17 comprises a connecting piece 171 and a vibration-proof pad 173, wherein the connecting piece 171 is fixed to the container body 2 via a lock-fastening structure (not shown in Figure), and the vibration-proof pad 173 is fixed to the connecting piece 171 via a snap-fitting structure (not shown in Figure). The vibration-proof component 17 mainly functions to prevent from collisions during the transportation process. Moreover, when a large-sized FOUP is manually transported, the opening of FOUP faces upward during the transportation process, and thus the vibration-proof pad 173 also offers a non-slip function to ensure that displacement of wafers in the FOUP 1 does not occur due to horizontal carriage movement when the FOUP 1 is transported.

The vibration-proof pad 173 of the vibration component 17 may wear after long-term usage, and therefore the snap-fitting structure (not shown in Figure) fixing the vibration-proof pad 173 to the connecting piece 171 facilitates the replacement of vibration-proof pad 173. What is to be emphasized here is that, the connecting piece 171 in the present embodiment is fixed to the container body 2 via a lock-fastening structure (not shown in Figure) and the vibration-proof pad 173 is fixed to the connecting piece 171 via a snap-fitting structure (not shown in Figure), yet the method for joining and fixing is not limited in the present invention. Moreover, the material of vibration-proof pad 173 in the present embodiment is elastic rubber but is not limited in the present invention and any other material that offers collision-proof and non-slip functions is regarded as within the scope of the present invention.

Figure 8B:
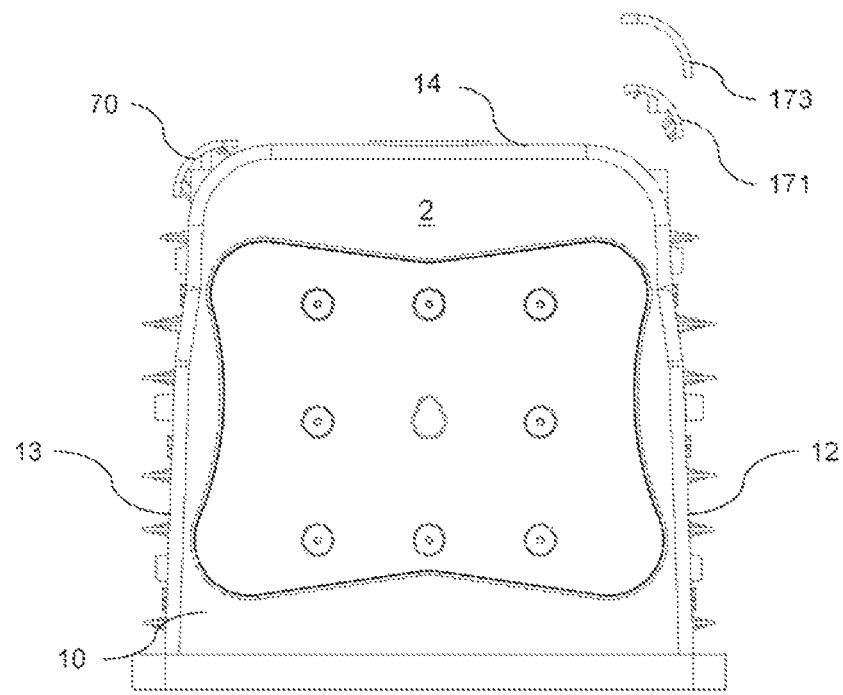
FIG. 8B is a view of the vibration-proof component of the present invention being assembled.

Then, referring to FIG. 8B, which is a view of the vibration-proof component of the present invention being assembled. As shown in FIG. 8B, after the assembly of vibration-proof component 17 is completed, the vibration-proof component 17 protrudes out of the container body 2; therefore, when the container body 2 collides with the floor or a wall, direct contact between the container body 2 and the collided object can be avoided and the wafers within can be protected.

Figure 9:
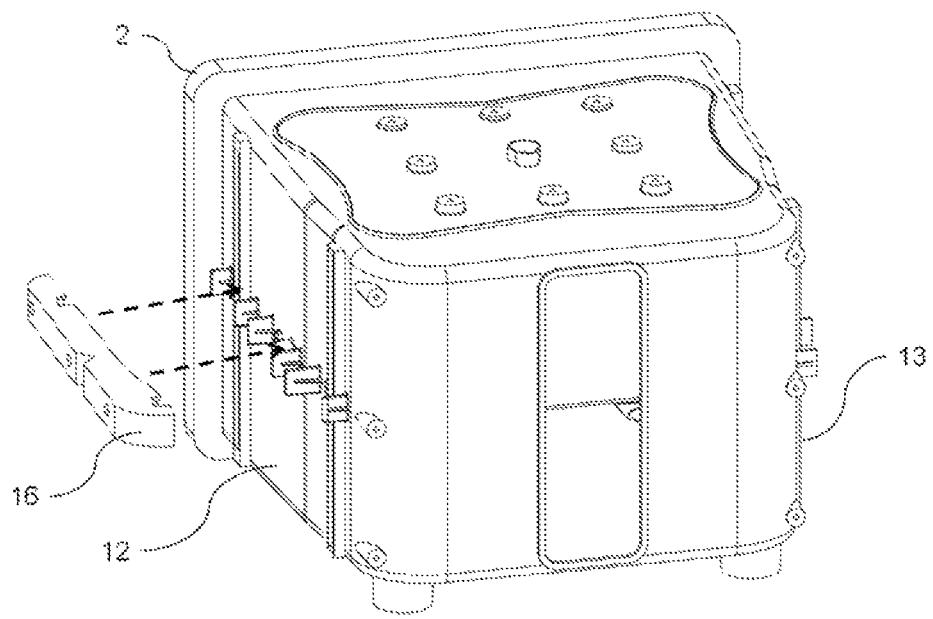
FIG. 9 is a view of the flank portions of the present invention being assembled.

Then, referring to FIG. 9, which is a view of the flank portions of the present invention being assembled. The flank structure is a part of standard structure required by SEMI standards and the function of which is for the robot to move the whole FOUP via the flank structure. As shown in FIG. 9, a flank portion 16 is respectively disposed on the outer side of right side 12 and the outer side of left side 13 for the container body 2 to correspond to SEMI standards. The flank portions 16 are to reinforce the structure of the container body 2 and prevent the container body 2 from deforming due to the stress induced by the material when being formed with one-piece injection molding, so the flank portions 16 are disposed on the outer side of right side 12 and the outer side of left side 13 of the container body 2 after the container body 2 is formed; the assembling method of the flank portions 16 with the container body 2 is not limited in the present invention.

Figure 10:
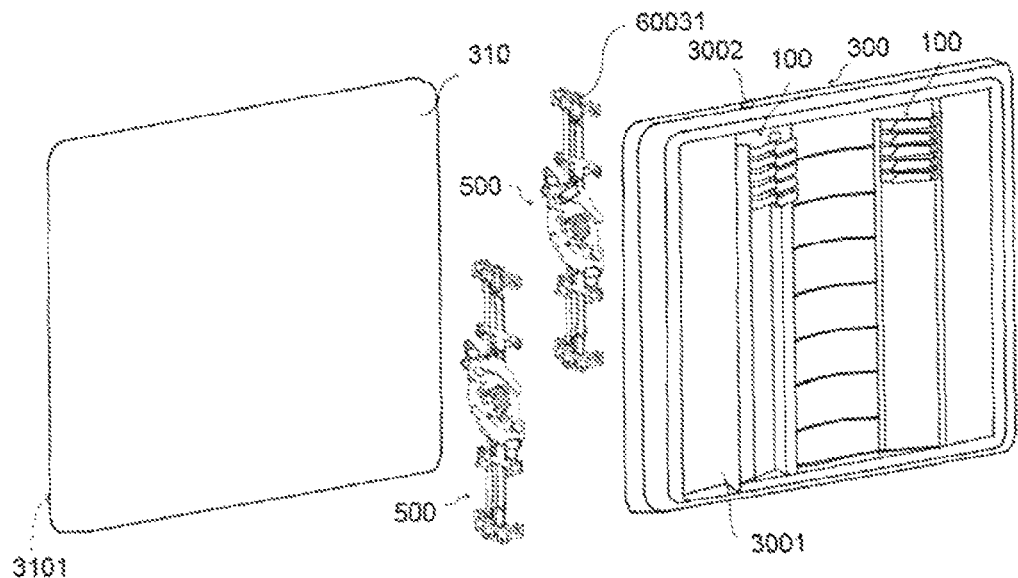
FIG. 10 is an explosive view of the door of the present invention.

Then, referring to FIG. 10, which is an explosive view of the door of the present invention. As shown in FIG. 10, the door 3 comprises a case member 300 and an enclosing board 310 having an outer surface 3101. The case member 300 has an outer surface of the case member 3001 opposite to the opening 15 and an inside surface of the case member 3006 (please refer to FIG. 15). The outer surface of the case member 3001 has a concave area 3005 and two first platforms 3008. The concave area 3005 is disposed in the middle of the outer surface of the case member 3001. The two first platforms 3008 are disposed in the outer surface of the case member 3001 and respectively located at two side of the concave area 3005. The outer surface of the case member 3001 further has an inclined area 3003 between each of the two first platform 3008 and the concave area 3005, and a connection position between the inclined area 3003 and the first platforms 3008 is higher than a connection position between the inclined area 3003 and the concave area 3005. The outer surface of the case member 3001 is disposed with a pair of elastic retaining structures 100 to retain wafers in the FOUP, the method of which will be described in detail in the following; in addition, a pair of latch structures 500 are disposed in the case member 300, and with the assembly of the case member 300 and the enclosing board 310, the pair of latch structures 500 are also located within the door 3; wherein each of the latch structures 500 has a latch bolt 60031 that corresponds to the latch holes 3002 on the case member 300 and the sockets 107 on the container body 2 (please refer to FIG. 2).

Figure 11:
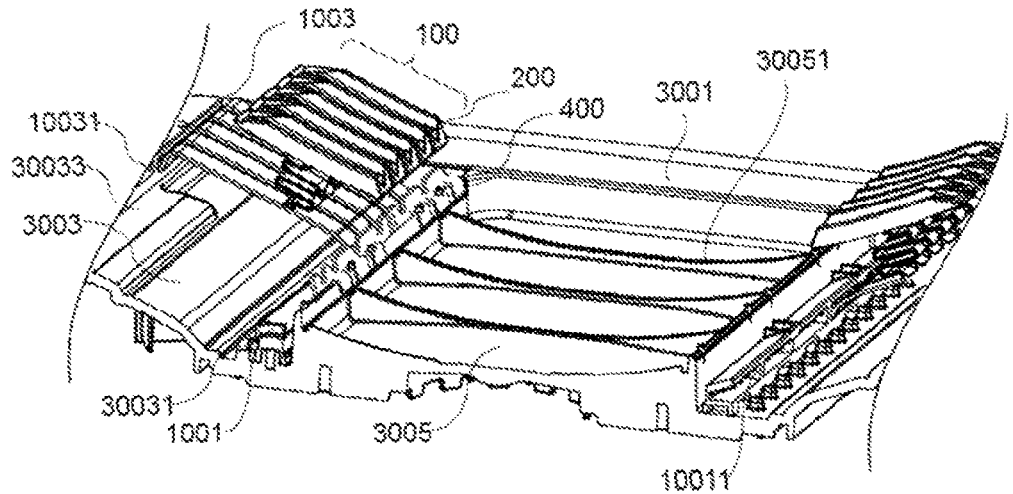
FIG. 11 is a view of the outer surface of case member of the present invention.

Referring to FIG. 11, which is a view of the outer surface of case member of the door of the present invention. As shown in FIG. 11, a pair of inclined areas 3003 are disposed on two sides of the concave area 3005 of the outer surface of case member 3001 and slanted in relation to the concave area 3005 of the outer surface of case member 3001 with a distance between the pair of inclined areas 3003 disposed opposite each other, wherein a curved structure is formed between the pair of inclined areas 3003 and the concave area 3005 of the outer surface of case member 3001, and an elastic retaining structure 100 is respectively disposed on each bevel; the elastic retaining structure 100 comprises: a first clip bar 1001, which is disposed on the bottom end 30031 of the inclined area 3003 near the concave area 3005 and has a plurality of first slots 10011, a second clip bar 1003, which is disposed on the top end 30033 of the inclined area 3003 near the outer surface of case member 3001 and has a plurality of second slots 10031, and a retaining piece 200, which is disposed between the first clip bar 1001 and the second clip bar 1003; moreover, a plurality of ribs 30051 are further added in the concave area 3005 to reinforce the structure of the door 3.

Figure 12:
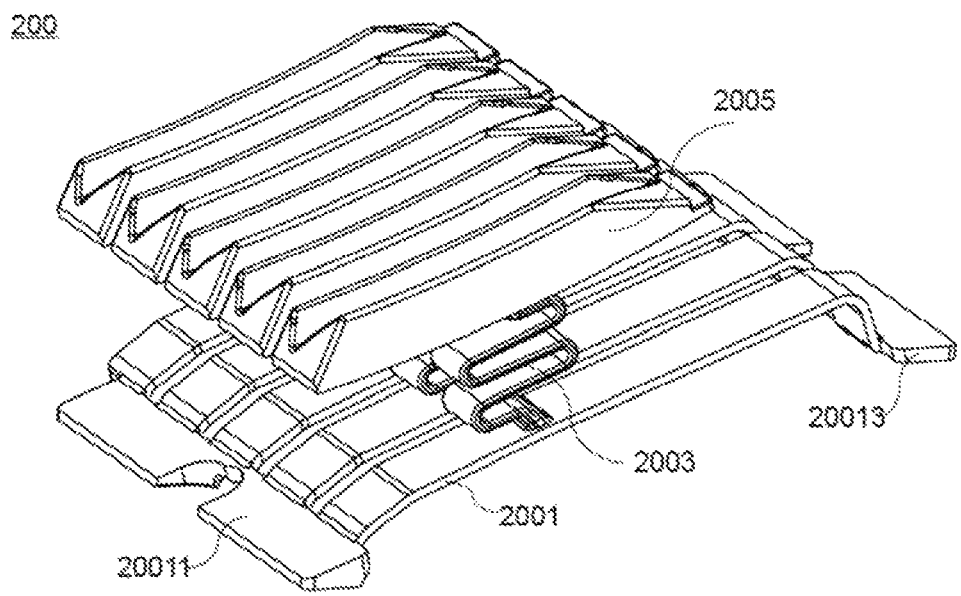
FIG. 12 is a view of the retaining piece of the present invention.

Referring then to FIG. 12, which is a view of the retaining piece of the present invention. As shown in FIG. 12, the retaining piece 200 comprises: a long spring piece 2001, which has a first end 20011 and a second end 20013 opposite to the first end 20011, a long V-shaped piece 2005, and a S-shaped spring piece 2003 that is respectively connected to the long spring piece 2001 and the long V-shaped piece 2005; in a most embodiment of the present invention, a retaining module is composed of five retaining pieces 200 and five retaining modules corresponding to the supporting modules 30 in the container body 2 are disposed; the number of the assembly of retaining pieces 200 is not limited in the present invention.

Figure 13:
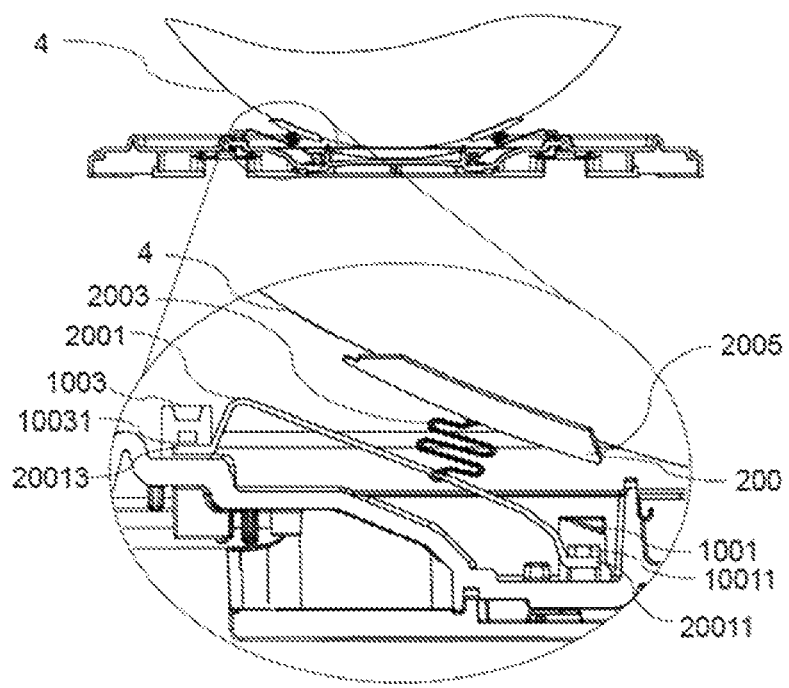
FIG. 13 is an installation view of the retaining piece of the present invention.

Referring then to FIG. 13, which is an installation view of the retaining piece of the present invention. As shown in FIG. 13, the retaining piece 200 is disposed between the first clip bar 1001 and the second clip bar 1003, and the first end 20011 of the long spring piece 2001 of the retaining piece 200 is inserted into the first slot 10011 of the first clip bar 1001; the installation is completed when the second end 20013 of the long spring piece 2001 is inserted into the second slot 10031 of the second clip bar 1003.

When wafers 4 are placed in the container body 2 and the door 3 is closed, the retaining pieces 200 disposed on the outer surface of case member 3001 of the door 2 snap-fit the wafers 4, and the long V-shaped pieces 2005 of the retaining pieces 200 snap-fit the wafers 4 in the V-shaped structure and keep each of the wafers 4 in the container body separated from each other; while the wafers 4 are placed in the container body 2 with the door 3 closed, the retaining pieces 200 are compressed by the wafers 4, and since the long spring pieces 2001 and the S-shaped spring pieces 2003 are elastic structures, they can generate and exert a clamping force on the wafers 4, and therefore, with the S-shaped spring pieces 2003, the retaining pieces 200 can sway sideways to exert a clamping force both vertically and from the left and right sides during vibration (i.e. transportation process) and can also prevent wafers 4 from spinning to ensure the stability and safety of wafers 4. Moreover, the curved structure formed between the inclined areas 3003 and the concave area 3005 of the outer surface of case member 3001 can form an accommodation space when retaining pieces 200 are compressed by the wafers 4; the curved structure helps reduce the volume and weight of the door 3.

Figure 14:
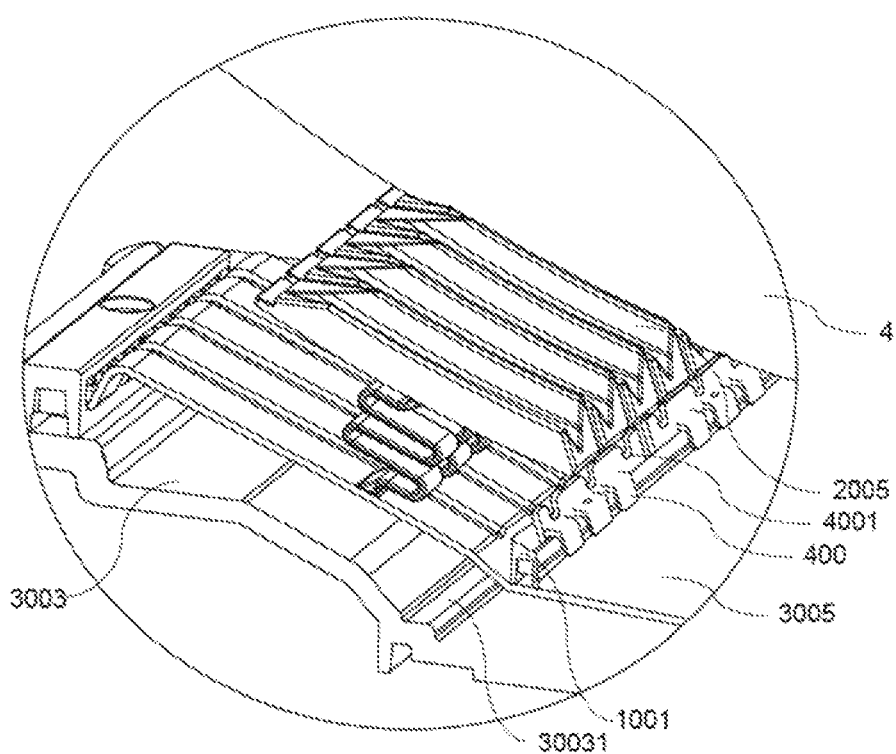
FIG. 14 is a view of the positioning pieces of the present invention.

Then, refer to FIG. 14, which is a view of the positioning pieces of the present invention. As shown in FIG. 14, a positioning piece 400 is respectively disposed at the joint where the bottom end 30031 of the inclined area 3003 opposite the outer surface of case member 3001 connects the central area 305, wherein each of the positioning pieces 400 has a gap 4001 corresponding to the V-shaped structure of the long V-shaped piece 2005; therefore, when a wafer is placed in the V-shaped structure of the long V-shaped piece 2005, it is also accommodated by the gap 4001 of the positioning piece 400; as the wafer may vibrate up and down during the transportation process, the gap 4001 of the positioning piece 400 prevents the wafer from going up and down when being carried and further stabilizes the wafer; in an embodiment of the present invention, five positioning piece modules respectively composed of five positioning pieces are disposed and correspond to the retaining modules disposed on the door 3, wherein the number of assembly of positioning pieces 400 is not limited in the present invention.

Figure 15:
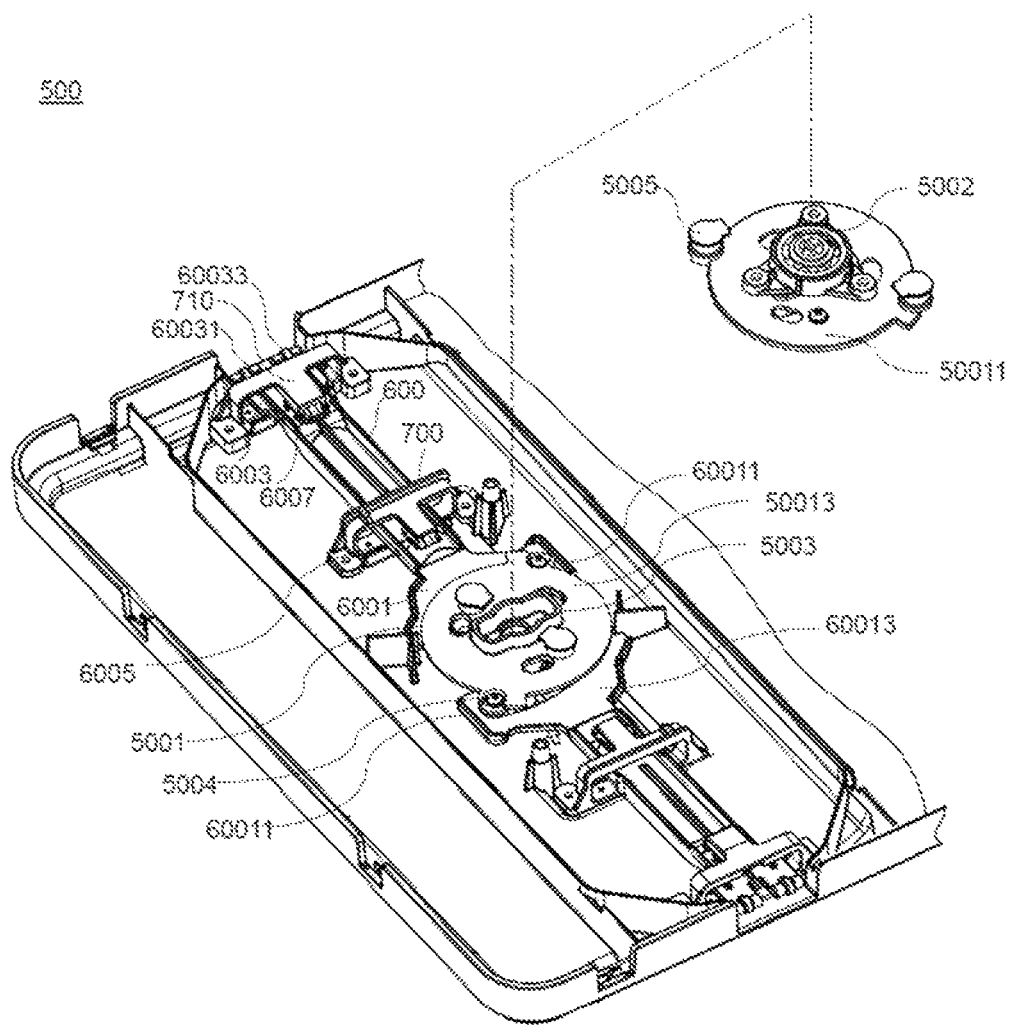
FIG. 15 is a view of the latch structure of the present invention.

Referring then to FIG. 15, which is a view of the latch structure of the present invention. As shown in FIG. 15, the inside surface of the case member 3006 has two second platforms 3007, and the two second platforms 3007 are respectively located in two side of the inside surface of the case member 3006 and opposite to the two first platforms 3008. Each of the pair of the latch structures 500 comprises: a circular rotary 5001, which has a first surface 50011 facing the inside surface of the case member 3006 and a second surface 50013 facing the enclosing board 310, the first surface 50011 being disposed with a rotating portion 5002 and the center of the second surface 50013 being disposed with a braking portion 5003, a pair of driving pieces 5004, which are formed on two opposite ends on the periphery of the circular rotary 5001, a pair of sliding devices 600, which are respectively disposed on two opposite sides of the periphery of the circular rotary 5001, each sliding device 600 having a first end 6001 close to the circular rotary 5001 and a second end 6003 opposite to the first end 6001, the first end 6001 being formed with a hook-shaped engaging portion 60011 and a sliding portion 60013 and the second end 6003 being formed with a latch bolt 60031 that corresponds to the latch holes 3002 of the door 3, wherein the hook-shaped engaging portions 60011 hook the driving pieces 5004 for the sliding devices 600 to be engaged with the circular rotary 5001; the driving piece 5004 can be a bearing device but is not limited in the present invention, and the driving piece 5004 can be further disposed with a buckle 5005, which functions to prevent the driving piece 5004 from breaking loose.

A plurality of bolt rollers 60033 are disposed at the end of the latch bolt 60031 and facilitate the sliding of the latch bolt 60031 when it is inserted into the sockets 107 of the container body 2 to prevent it from getting stuck; moreover, the sliding device 600 is further disposed with a first sliding roller 6005 and a second sliding roller 6007; what is to be emphasized here is that, a first sliding roller 6005 and a second sliding roller 6007 are disposed on the sliding device 600 in the present embodiment of the invention, but the number of the sliding roller is not limited in the present invention. A first guiding structure 700 is further disposed where the first sliding roller 6005 is located and a second guiding structure 710 is further disposed where the second sliding roller 6007 is located; the first guiding structure 700 and the second guiding structure 710 are disposed to frame each sliding device 600 within the second platform 3007 and to prevent the sliding device 600 of the latch structure 500 from swaying sideways, the material of the guiding structures are a wear-resistant material.

Figure 16:
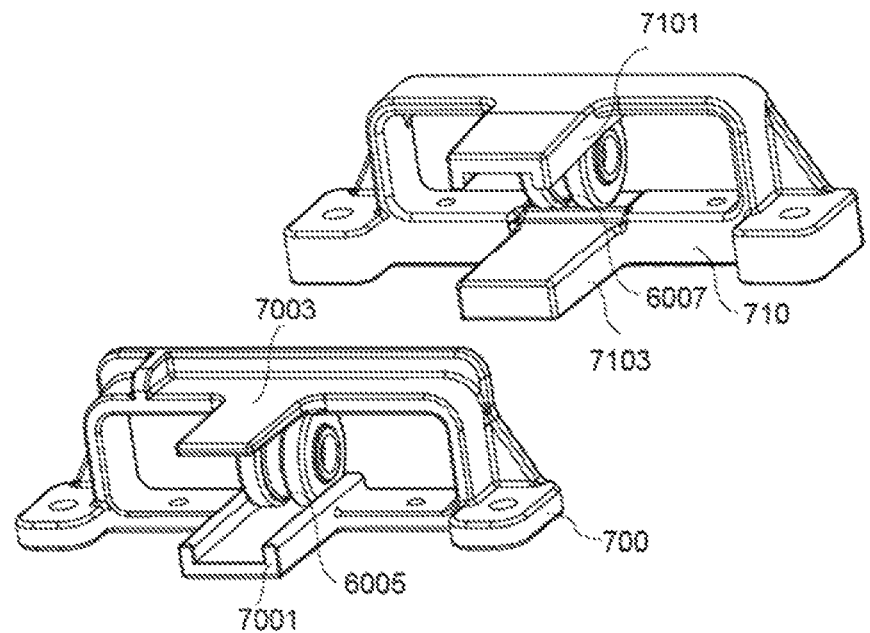
FIG. 16 is a view of the guiding structure of the present invention.

Then, refer to FIG. 16, which is a view of the guiding structure of the present invention. As shown in FIG. 16, a first track 7001 is disposed under the first guiding structure 700, and a first clamping piece 7003 is disposed above the first track 7001, wherein the first clamping piece 7003 keeps the first sliding roller 6005 along the first track 7001 and prevents it from swaying sideways; a second track 7101 is disposed above the second guiding structure 710, and a second clamping piece 7103 is disposed under the second track 7101, wherein the second clamping piece 7103 keeps the second sliding roller 6007 along the second track 7001 and prevents it from swaying sideways; what is to be emphasized is that, the first track 7001 under the first guiding structure 700 and the second track 7101 above the second guiding structure 710 are used in the present invention to retain and prevent the sliding device 600 from swaying sideways, but neither the number nor the position of track is limited in the present invention; an embodiment in which tracks are disposed both above and under the first guiding structure 700 and the second guiding structure 710 is also an embodiment of the present invention.

Figure 17:
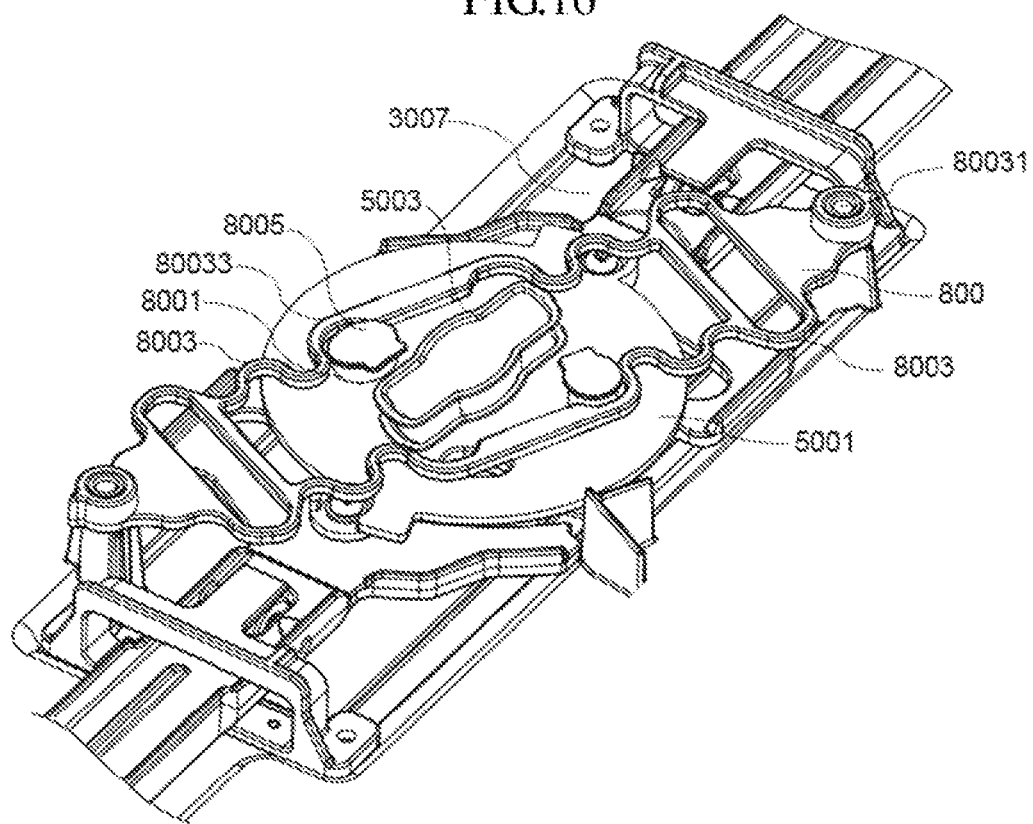
FIG. 17 is a view of the retaining structure of the present invention.

Referring then to FIG. 17, which is a view of the retaining structure of the present invention. As shown in FIG. 17, the latch structure 500 is further disposed with a retaining structure 800, which comprises: a pair of retaining axles 8001 respectively disposed on two sides of the braking portion 5003 of the circular rotary 5001 and an elastic retaining frame 8003, which has a pair of fixed portions 80031 on two opposite ends and a pair of retaining frames 80033 respectively connected to the fixed portions 80031, wherein the pair of fixed portions 80031 are fixed to the second platform 3007 of the case member 300, and the pair of retaining frames 8003 retain the pair of retaining axles 8001 within them and are curved elastic structures; moreover, the retaining axles 8001 can be further disposed with a buckle 8005, which functions to retain the retaining axles 8001 and prevent them from breaking loose.

Figure 18A:
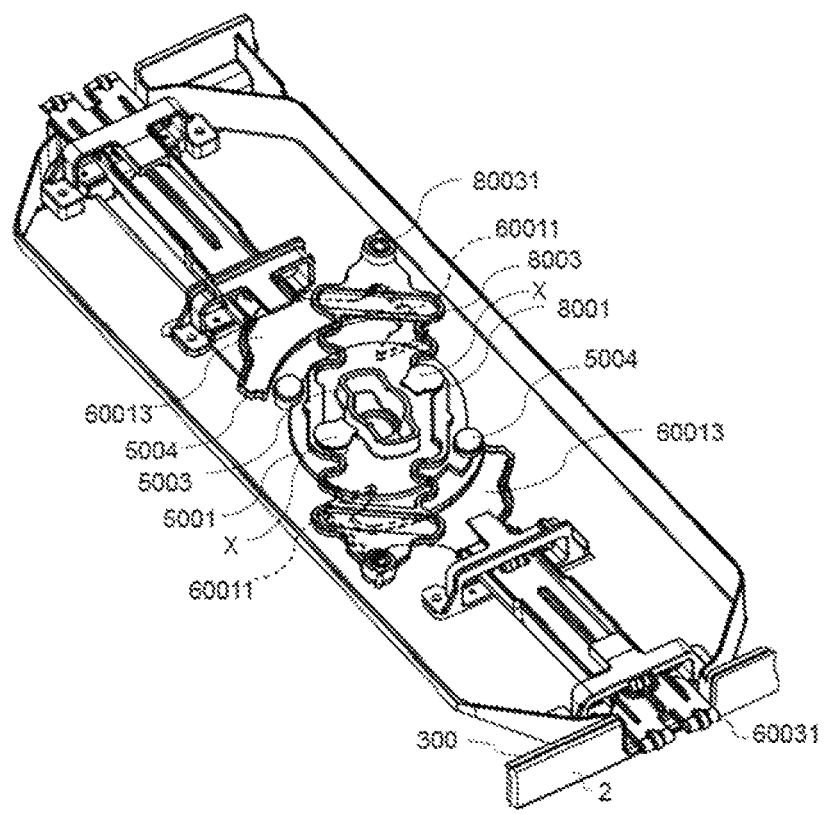
FIG. 18A is a view of the latch structure of the present invention when being locked.
Figure 18B:
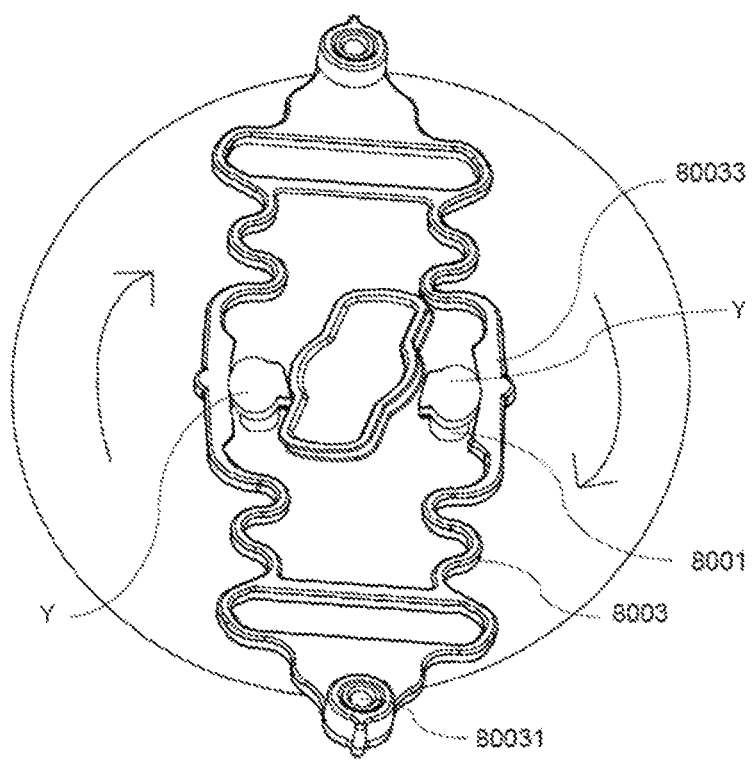
FIG. 18B is a view of the latch structure of the present invention in the process of being unlocked.
Figure 18C:
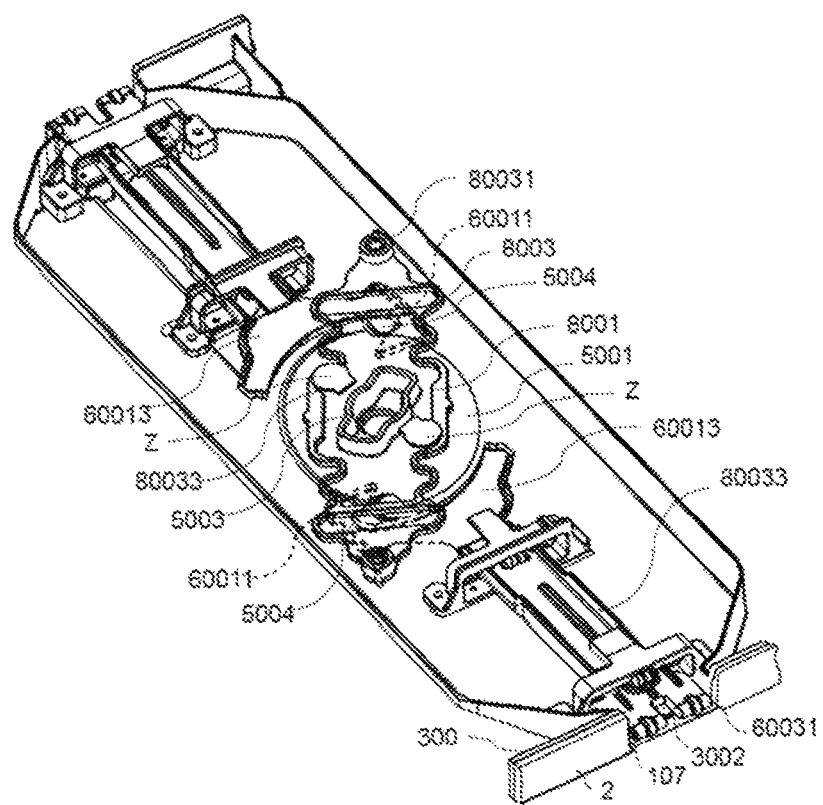
FIG. 18C is a view of the latch structure of the present invention when being unlocked.

And referring then to FIGS. 18A to 18C, which are views of the latch structure of the present invention in operation. First, as shown in FIG. 18A, when the door 3 locks the container body 2, the latch bolt 60031 of the sliding device 600 inserts into the sockets 107 of the container body 2 via the latch holes 3002 on the case member 300, and meantime the driving pieces 5004 that are at the position of the sliding portion 60013 push the sliding portion 60013 to drive the sliding devices 600 to be securely fitted into the sockets 107, and the retaining axles 8001 snap-fit to the curved elastic structure of the retaining frames 8003 at the position X.

Then, as shown in FIG. 18B, when the door 3 is to be opened, the unlocking piece (not shown in Figure) is inserted into the braking portion 5003 of the circular rotary 5001 and turned clockwise, and meantime the retaining axles 8001 on the circular rotary 5001 rotate as well and prop open the retaining frames 8003; the retaining frames 8003 are elastic and also sturdy to a certain degree, and therefore the retaining axles 8001 will not be displaced when they snap-fit at the aforementioned position X due to the sturdiness of the retaining frames 8003; and when the unlocking piece (not shown in Figure) turns the circular rotary 5001, the retaining axles 8001 will prop open the elastic retaining frames 8003 due to the exertion of external force but without damaging the retaining frames 8003.

And then as shown in FIG. 18C, when the door 3 is opened, the circular rotary 5001 is rotated 45° clockwise, the driving pieces 5004 slide into the position of the hook-shaped engaging portions 60011 along the sliding portions 60013 and thus drive the sliding devices 600 to draw in and lead the latch bolt 60031 to slide out of the sockets 107 of the container body 2 for the latch structure 500 of the door 3 to be disengaged from the container body 2; in addition, the retaining axles 8001 move from the position X via the position Y to the position Z, the retaining frames 8003 snap back to their original, size when being retained, and the retaining axles 8001 snap-fit at the position Z.

Figure 19:
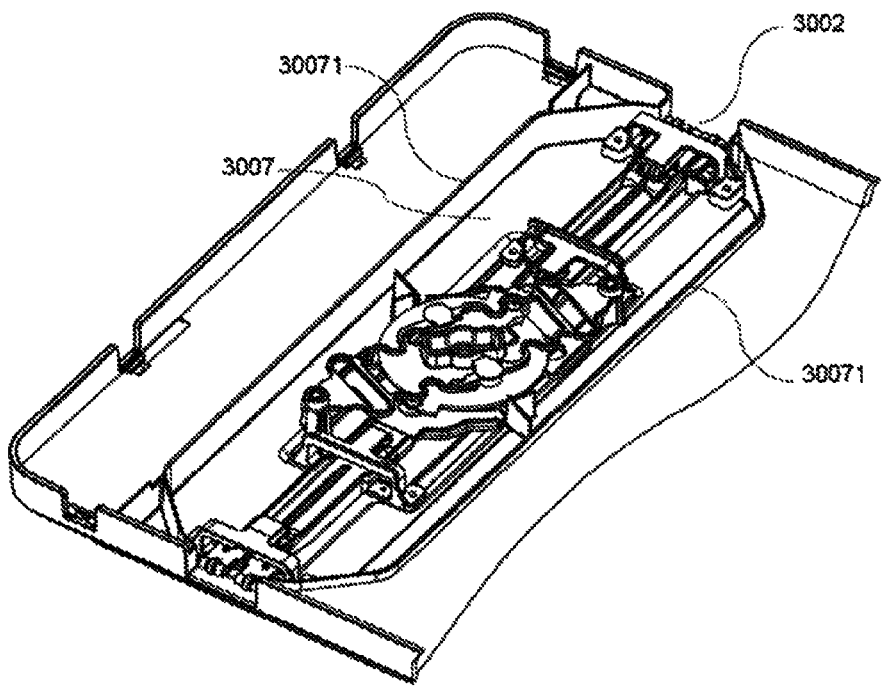
FIG. 19 is a view of the disposition of rubber strips of the present invention.

Referring to FIG. 19, which is a view of the disposition of rubber strips of the present invention. As shown in FIG. 19, a rubber strip 30071 surrounding the concave area 3007 is disposed on the periphery of the concave area 307 of the case member 300; when the case member 300 and the enclosing board 310 are joined with each other, the rubber strip 30071 disposed on the periphery of the concave area 307 will tightly adhere to the enclosing board 310 and the concave area 307 will thus be isolated from other parts of the case member 300 and form an enclosed area, wherein only the latch holes 3002 on the case member 300 are not closed.

As the door 3 will be constantly opened and closed when the FOUP 1 is used in the process, even if the material of the guiding structures in the door 3 is a wear-resistant material, particles or dust will still be generated due to friction after the sliding devices 600 slide for multiple times, and therefore the latch structure 500 disposed within needs to be cleaned. Thanks to the enclosed area formed as described above, a cleaning solvent (such as water) can be instilled via the upper latch hole 3002 and expelled via the lower latch hole 3002 without seeping into other parts of the door 3 since the rubber strip 30071 already forms an enclosed area, whereby the door 3 can dry faster after being cleaned and the cleaning process can also become more convenient.

Figure 20:
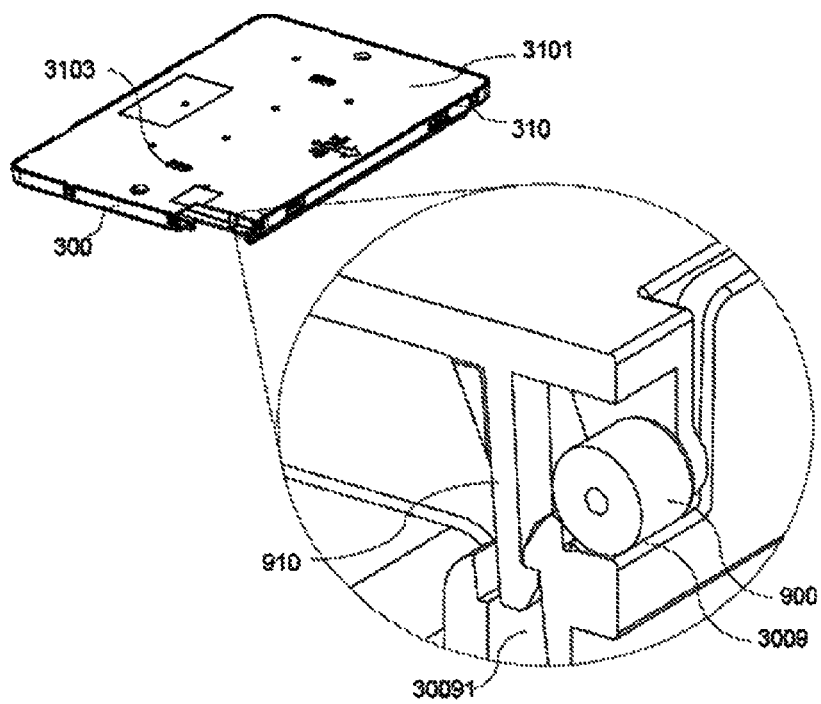
FIG. 20 is a view of the enclosing board of the present invention.

Referring then to FIG. 20, which is a view of the enclosing board of the present invention. As shown in FIG. 8, a plurality of door-side rollers 900 are disposed at the edge of the enclosing board 310, and a snap-hook structure 910 is disposed behind the door-side rollers 900; a plurality of roller grooves 3009 corresponding to the door-side rollers 900 are disposed at the edge of the case member 300, and a snap-hook groove 30091 corresponding to the snap-hook structure 910 is disposed below the roller grooves 3009. When the enclosing board 310 and the case member 300 are joined with each other, the door-side rollers 900 are placed in the roller grooves 3009 and the snap-hook structure 910 is embedded in the snap-hook groove 30091 for engaging the enclosing board 310 and the case member 300 with each other, wherein the door-side rollers 900 function to help the door 3 slide smoothly onto the container body 2 when the container body 2 is closed by the door 3 and avoid accidental collision. Furthermore, a pair of lock holes 3103 corresponding to the braking portions 5003 of the latch structure 500 are disposed on the enclosing board 310; when the enclosing board 310 and the case member 300 are joined with each other, the unlocking piece (not shown in Figure) can be inserted via the lock holes 3103 into the braking portions 5003 of the circular rotary 5001 for the unlocking task to be performed.

While the invention has been described by way of examples and in terms of the embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A front opening unified pod (FOUP), comprising:
    a container body, having an opening for importing and exporting a plurality of wafers, two opposite edges at said opening of said container body respectively disposed with at least a pair of sockets;
    a door, joined with said opening of said container body for protecting said plurality of wafers inside said container body, and two opposite edges of said door respectively disposed with at least a pair of latch holes corresponding to said pair of sockets;

a pair of latch structures, disposed in said door, each of said pair of said latch structures comprising:

a circular rotary, having a first surface and a second surface, said first surface disposed with a rotating portion and said second surface disposed with a braking portion in a central area of said second surface;

at least a pair of driving pieces formed on two opposite ends on periphery of said circular rotary; and a pair of sliding devices respectively disposed on two opposite sides of periphery of said circular rotary, each of said pair of sliding devices having a first end close to said circular rotary and a second end opposite to said first end, said first end formed with a hook-shaped engaging portion and a sliding portion and said second end formed with at least a latch bolt that corresponds to said latch holes of said door, wherein, said hook-shaped engaging portions hook said driving pieces for said sliding devices to be engaged with said circular rotary, and rotation of said circular rotary is controlled by said braking portion, and said latch bolts of said sliding devices are thus driven to and fro between said pair of sockets and said pair of latch holes.

2. The FOUP according to claim 1, wherein the door comprises a case member and an enclosing board, said case member has an outside surface and an inside surface, said door joined with said opening of said container body via said outer surface of said case member, and said first surface of said circular rotary faces said inside surface of said case member and said second surface of said circular rotary faces said enclosing board, wherein said case member has a concave area in the middle of said outside surface of said case member, two first platforms respectively at two side of said concave area in said outside surface of said case member, and two second platforms in said inside surface of said case member and respectively in opposition to said two first platforms.

3. The FOUP according to claim 2, wherein said two second platforms are further respectively disposed a sidewall, said sidewalls respectively surrounds the periphery of said pair of latch structures from said pair of latch holes.

4. The FOUP according to claim 3, wherein said sidewalls respectively disposed a rubber strip for joining said case member and said enclosing board, said two second platforms respectively form an enclosed area in said door.

5. The FOUP according to claim 2, wherein said enclosed board is further disposed with a snap-hook structure and a snap-hook groove is further disposed surrounding inner edges of said case member of said door, said snap-hook structure being able to snap-fit into said snap-hook groove of said door.

6. The FOUP according to claim 5, wherein edge of said door is further disposed with at least a door-side roller, and said door-side roller protrudes out of edge of said door when said enclosing board and said case member are joined with each other.

7. The FOUP according to claim 1, wherein said latch structure further comprises at least a guiding structure for framing each of said sliding devices in said door, and material of said guiding structure is a wear-resistant material.

8. The FOUP according to claim 7, wherein said sliding devices are further disposed with at least a sliding roller and said sliding roller corresponds to said guiding structure.

9. The FOUP according to claim 1, wherein said driving pieces are bearing devices.

10. The FOUP according to claim 1, wherein said driving pieces are further disposed with a buckle.

11. The FOUP according to claim 1, wherein said latch bolt of said sliding devices is further disposed with at least a bolt roller.

12. A front opening unified pod (FOUP), comprising:

a container body, having an opening for importing and exporting said plurality of wafers, two opposite edges at said opening of said container body respectively disposed with at least a pair of sockets;

a door, joined with said opening of said container body for protecting said plurality of wafers inside said container body, and two opposite edges of said door respectively disposed with at least a pair of latch holes corresponding to said pair of sockets;

a pair of latch structures, disposed in the door, each of said pair of said latch structures comprising:

a circular rotary, having a first surface and a second surface, said first surface disposed with a rotating portion and said second surface disposed with a braking portion n a central area of said second surface;

at least a pair of driving pieces formed on two opposite ends on periphery of said circular rotary;

a pair of sliding devices respectively disposed on two opposite sides of periphery of said circular rotary, each of said pair of sliding devices having a first end close to said circular rotary and a second end opposite to said first end, said first end formed with a hook-shaped engaging portion and a sliding portion and said second end formed with at least a latch bolt that corresponds to said latch holes of said door, wherein, said hook-shaped engaging portions hook said driving pieces for said sliding devices to be engaged with said circular rotary, and each of said sliding devices is disposed with at least a sliding roller; and a retaining structure, comprising at least a pair of retaining axles respectively disposed on two sides of said braking portion of said circular rotary, and an elastic retaining frame having a pair of fixed portions located on two opposite ends and a pair of retaining frames respectively connected to said pair of fixed portions, said pair of fixed portions fixed to said door and said pair of retaining frames retaining said pair of retaining axles within said retaining frames;

rotation of said circular rotary controlled by said braking portion, and said latch bolts of said sliding devices thus driven to and fro between said pair of sockets and said pair of latch holes.

13. The FOUP according to claim 12, wherein the door comprises a case member and an enclosing board, said case member has an outside surface and an inside surface, said door joined with said opening of said container body via said outer surface of said case member, and said first surface of said circular rotary faces said inside surface of said case member and said second surface of said circular rotary faces said enclosing board, wherein said case member has a concave area in the middle of said outside surface of said case member, two first platforms respectively at two side of said concave area in said outside surface of said case member, and two second platforms in said inside surface of said case member and respectively in opposition to said two first platforms, and said pair of fixed portions fixed to said two second platforms of said case member.

14. The FOUP according to claim 13, wherein said two second platforms are further respectively disposed a sidewall, said sidewalls respectively surrounds the periphery of said pair of latch structures from said pair of latch holes, and said sidewalls respectively disposed a rubber strip for joining said case member and said enclosing board, said two second platforms respectively form an enclosed area in said door.

15. The FOUP according to claim 13, wherein said enclosed board is further disposed with a snap-hook structure and a snap-hook groove is further disposed surrounding inner edges of said case member of said door, said snap-hook structure being able to snap-fit into said snap-hook groove of said door.

16. The FOUP according to claim 15, wherein edge of said door is further disposed with at least a door-side roller, and said door-side roller protrudes out of edge of said door when said enclosing board and said case member are joined with each other.

17. The FOUP according to claim 12, wherein said latch structure further comprises at least a guiding structure for framing each of said sliding devices in said door, and material of said guiding structure is a wear-resistant material.

18. The FOUP according to claim 12, wherein said driving pieces and said retaining axles are bearing devices.

19. The FOUP according to claim 12, wherein said driving pieces and said retaining axles are further disposed with a buckle.

20. The FOUP according to claim 12, wherein said retaining frame is a curved elastic structure.

* * * * *